United States Patent [19]

Smoot et al.

[11] Patent Number: 5,145,757
[45] Date of Patent: Sep. 8, 1992

[54] METHOD OF FORMING STABLE IMAGES IN ELECTRON BEAM WRITABLE GLASS COMPOSITIONS

[75] Inventors: Stephen W. Smoot, Wilkes-Barre; Joseph S. Hayden, Clarks Summit, both of Pa.

[73] Assignee: Schott Glass Technologies, Inc., Duryea, Pa.

[21] Appl. No.: 369,997

[22] Filed: Jun. 23, 1989

[51] Int. Cl.$^5$ ............................ G03G 5/00; G11B 7/00
[52] U.S. Cl. ........................................ 430/5; 430/13; 430/14; 430/19; 430/270; 430/296; 430/321; 428/410; 428/426; 65/30.11
[58] Field of Search .............. 430/13, 14, 19, 270, 430/5, 296, 321; 428/410, 426; 65/30.11

[56] References Cited

U.S. PATENT DOCUMENTS

| | | | |
|---|---|---|---|
| 4,132,538 | 1/1979 | Eolin et al. | 65/72 |
| 4,160,654 | 7/1979 | Bartholomew et al. | 65/30 |
| 4,296,479 | 10/1981 | Wu | 365/119 |
| 4,894,303 | 1/1990 | Wu | 430/13 |

*Primary Examiner*—Charles L. Bowers, Jr.
*Assistant Examiner*—John A. McPherson
*Attorney, Agent, or Firm*—Millen, White & Zelano

[57] ABSTRACT

A silicate glass article comprising an amount of $SiO_2$ effective as a network former and, at least one surface of said article having a substantially continuous silver and hydration content over its area, effective to render said surface darkenable upon exposure to electron beam radiation but substantially not thermoplastic, said article having been substantially darkened by electron beam irradiation over at least a portion of at least one surface thereof, and said article having geometric characteristics suitable for functioning as a photomask reticle, optical disk or similar archival storage medium.

20 Claims, 2 Drawing Sheets

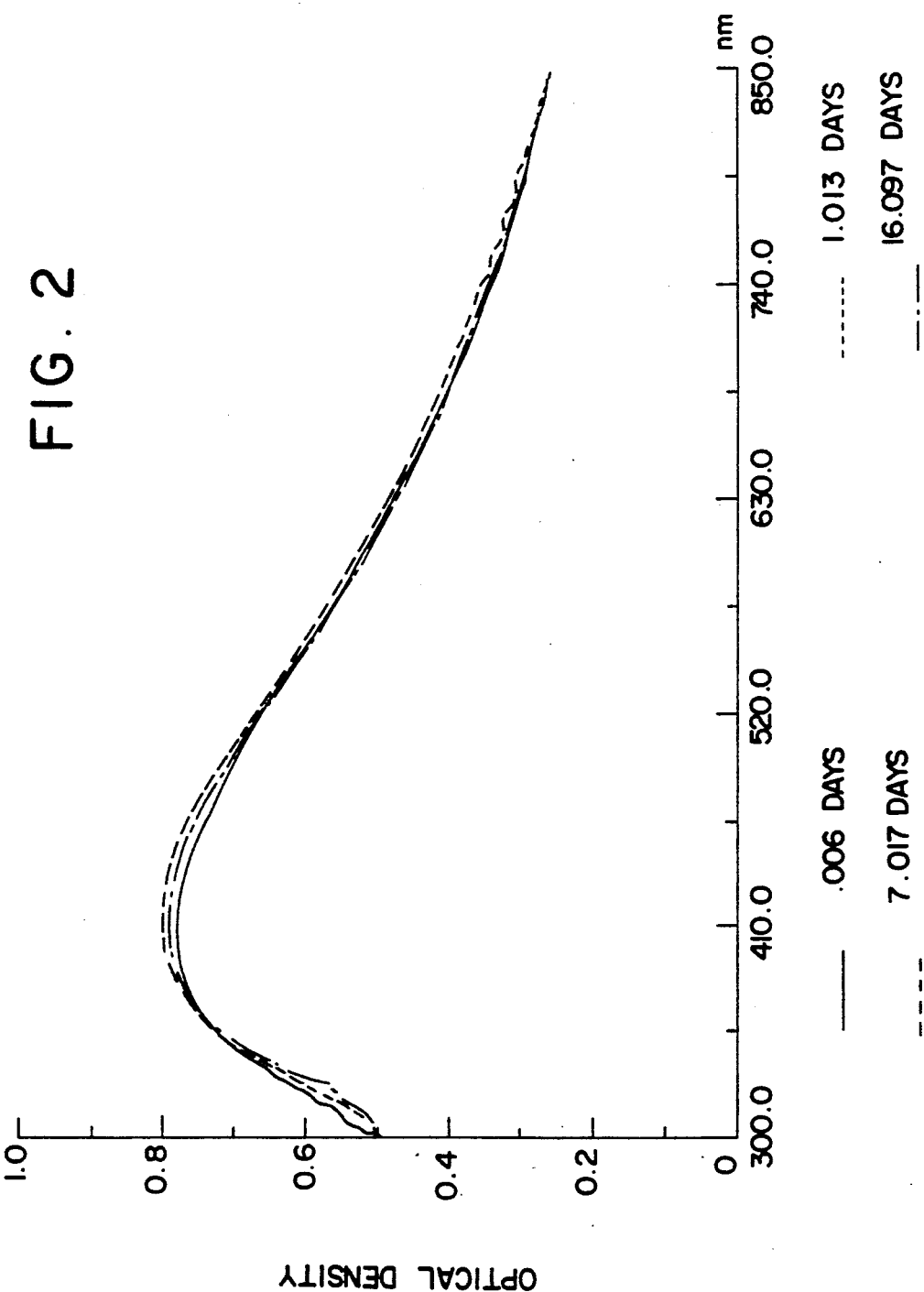

METHOD OF FORMING STABLE IMAGES IN ELECTRON BEAM WRITABLE GLASS COMPOSITIONS

BACKGROUND OF THE INVENTION

This invention relates to new glass articles having energy-sensitive portions which can be written by high-energy beams to record stable images.

Various devices are known for archival storage media. These include magnetic materials, etched chrome masks, and many others. Attempts have also been made to use glass for such applications. However, further improvements are still desired.

SUMMARY OF THE INVENTION

This invention is based on the surprising discovery that silicate glass compositions, hydrated and containing silver, can be effectively written with high-energy beams, e.g., electron beams, to produce high-optical-density images which are stable. These advantageous properties are achieved, surprisingly, with essentially no content in such compositions of transition metals having 1–4 d-electrons in the atomic state.

Accordingly, this invention relates to a glass article comprising the following composition in mole %:

|  |  |
|---|---|
| $SiO_2$ | 30–95 |
| $P_2O_5$ | 0–20 |
| $B_2O_3$ | 0–30 |
| $Al_2O_3$ | 0–40 |
| RO | 0–40 |
| $R_2O$ | 1–35 |
| halide | 0–10 | and essentially no transition metals having 1–4 d-electrons in the atomic state, wherein RO is MgO, CaO, SrO, BaO, ZnO and/or PbO, $R_2O$ is $Li_2O$, $Na_2O$, $K_2O$, $Rb_2O$ and/or $Cs_2O$, halide is Cl, F, Br and/or I, at least one surface of said article having a substantially continuous silver and hydration content over its area, effective to render said surface darkenable upon exposure to electron beam radiation but substantially not thermoplastic, said article having been substantially darkened by electron beam irradiation over at least a portion of at least one surface thereof, and said article having geometric characteristics suitable for functioning as a photomask reticle, optical disk or similar archival storage medium.

In another aspect, this invention relates to a glass article comprising the following composition in mole %:

|  |  |
|---|---|
| $SiO_2$ | 30–95 |
| $P_2O_5$ | 0–20 |
| $B_2O_3$ | 0–30 |
| $Al_2O_3$ | 0–40 |
| RO | 0–40 |
| $R_2O$ | 1–35 |
| halide | 0–10 | and essentially no transition metals having 1–4 d-electrons in the atomic state, wherein RO is MgO, CaO, SrO, BaO, ZnO and/or PbO, $R_2O$ is $Li_2O$, $Na_2O$, $K_2O$, $Rb_2O$ and/or $Cs_2O$, halide is Cl, F, Br and/or I, at least one surface of said article having a substantially continuous silver and hydration content over its area, effective to render said surface darkenable upon exposure to electron beam radiation but substantially not thermoplastic, said article substantially not exhibiting alterable photo-anisotropic effects induced by actinic UV radiation, and said article having geometric characteristics suitable for functioning as a photomask reticle, optical disk or similar archival storage medium.

In a further aspect, this invention relates to a silicate glass article comprising an amount of $SiO_2$ effective as a network former and, at least one surface of said article having a substantially continuous silver and hydration content over its area, effective to render said surface darkenable upon exposure to electron beam radiation but substantially not thermoplastic, said article having been substantially darkened by electron beam irradiation over at least a portion of at least one surface thereof, and said article having geometric characteristics suitable for functioning as a photomask reticle, optical disk or similar archival storage medium.

In yet a further aspect, this invention relates to a silicate glass article comprising an amount of $SiO_2$ effective as a network former and, at least one surface of said article having a substantially continuous silver and hydration content over its area, effective to render said surface darkenable upon exposure to electron beam radiation but substantially not thermoplastic, said article substantially not exhibiting alterable photo-anisotropic effects induced by actinic UV radiation, and said article having geometric characteristics suitable for functioning as a photomask reticle, optical disk or similar archival storage medium.

In other aspects, this invention relates to methods of forming an image readable by actinic radiation, e.g., UV or visible radiation, comprising writing such an image in a glass article of this invention by electron-beam irradiation thereof. The invention also relates to methods of erasing such images by heating of the glass articles containing the images.

This invention also relates to various other aspects and features as described below.

A wide range of silicate glass compositions is applicable for this invention. In essence, these need be adequate to provide a silicate glass having the necessary characteristics for a given application and contain therein at least one surface which has a content of silver and is hydrated, typically substantially continuously over the entire area of the surface; such that the resultant hydrated silver composition is sensitive to high-energy radiation such as electron beams to darken under its influence.

The compositions also are to be essentially devoid of all transition metals having 1–4 d-electrons in the atomic state. These include Sc, Ti, V, Y, Zr, Nb, La, Hf, Ta and W. Preferably, the glasses of this invention are also essentially devoid of all metals having 1–4 d-electrons in the atomic state, such as, for example, Gd, Lu, Th, Pa, U, Np, Cm, etc.

Within the context of this invention, the term "substantially (or essentially) free of" a component means that the component is not intentionally added to the batch composition for preparation of a glass but, rather, is unavoidably present therein as an impurity in other batch components and, thus, will be present in the final glass composition in trace amounts. Similarly, other impurities can be derived from processing of the glass melt. Nevertheless, it is highly preferred that the glass compositions used in this invention be entirely devoid of transition metals having 1–4 d-electrons in the atomic state, and also all such metals. Where the presence of such undesired components, e.g., such metals, is practically unavoidable, the resultant trace amounts should be preferably maintained less than 0.1 mole % if possible; of course, higher amounts can be included where the consequent adverse effects can be tolerated in the end-use.

By the expression "substantially darkened by electron-beam radiation" is meant a degree of darkening which is significantly greater than any inadvertent darkening which might occur, for example, in SEM measurements or analyses of a glass composition. Typically, the degree of darkening will be that which is sufficient for use of any resultant image based on the darkened portions as an archival storage medium as described above. The precise optical density involved will depend on the end-use requirements and can be, for example, equal to or greater than 0.1, 0.5, 1, 1.5, 2, 2.5, 3, and higher, etc.

Thus, the silver-containing surfaces of this invention will typically have silver more or less uniformly and homogeneously distributed continuously over a surface, as opposed to discretely, e.g., in a pattern.

Furthermore, the silver-containing surfaces of this invention preferably do not exhibit any substantial alterable photo-anisotropic effects induced or inducible by actinic UV radiation such as the effects described in U.S. Pat. Nos. 4,191,547, 4,296,479 and 4,297,417, each of which is entirely incorporated by reference herein. Thus, the glass articles of this invention will not be exposed to sufficiently high doses of UV radiation whereby such alterable photo-anisotropic properties could be induced where applicable. Thus, in normal use as an archival storage medium, the glass articles of this invention would be exposed to low-level UV radiation effective for reading an image in the medium. Typically, many months, on the order of many years, will pass before a sufficient dose of UV radiation has been received by a glass article of this invention to produce any significant alterable photo-anisotropic effects, if ever, for any glass articles of this invention which might somehow inherently be capable of producing such effects. Preferably, the glass articles of this invention exhibit essentially no alterable photo-anisotropic effects induced by any kind of radiation, e.g., e-beam, X-ray, etc.

A preferred composition for use in conjunction with this invention has the following composition in mole %:

| | |
|---|---|
| $SiO_2$ | 40–90 |
| $P_2O_5$ | 0–5 |
| $B_2O_3$ | 0–30 |
| $Al_2O_3$ | 0–15 |
| RO | 5–30 |
| $\Sigma Li_2O, Na_2O, K_2O$ | 5–25 |
| halide | 0–6. |

A most preferred composition for use in this invention has the following composition in mole %.

| | |
|---|---|
| $SiO_2$ | 50–85 |
| $P_2O_5$ | 0–2 |
| $B_2O_3$ | 0–20 |
| $Al_2O_3$ | 0–5 |
| RO | 5–20 |
| $\Sigma Li_2O, Na_2O, K_2O$ | 5–25 |
| Cl | 0.1–6. |

Silica is used in the glasses of this invention as the principal glass former. Levels of silica too low generally result in glasses which possess thermomechanical properties, particularly thermal expansion, which are undesirable in applications of the materials of this invention to situations requiring the recording, reading, or transferring of microscopic optical density patterns generated in the material by electron-beam irradiation. High levels of silica impart lower thermal expansion values but decrease the meltability of such compositions.

The addition of $Al_2O_3$ and RO (R=Mg, Ca, Sr, Ba, Zn, Pb) impart chemical durability to the produced glass compositions and also impart during manufacturing of the glass articles an increased stability and reduced tendency towards crystallization. Zn is preferred, as well as Ca.

The presence of $R_2O$ (R=Li, Na, K, Rb, Cs) is of particular importance when the materials are to be subjected to an ion-exchange treatment of silver for alkali ions. Levels of alkali ions too low give insufficient ion-exchangeability, whereas levels too high reduce the chemical durability of the produced glasses resulting in the potential chemical attack of glass samples during the ion-exchange treatment. Li, Na and K are preferred.

The presence of halides in the produced glass articles, preferably Cl, significantly enhances the sensitivity of such glass articles to electron beams.

It is essential that glass compositions of the present invention be free from transition metal oxides having from 1 to 4 d-electrons in the atomic state as these constituents impart to electron beam induced images in the glass an instability with time and temperature which is undesirable for application of these materials as archival storage media.

The presence of polyvalent species, such as $As_2O_3$, $Sb_2O_3$, $SnO_2$, $Bi_2O_3$ and $GeO_2$, can act as electron donors to silver ions entering the glass structure during ion exchange. Thus, in the glass compositions, they will increase the extent to which silver ions are reduced to silver metal precipitates during ion exchange Correspondingly, the glasses of this invention preferably should be substantially devoid of these components also.

It is also possible for the glass compositions of this invention to contain other components achieving desirable properties for the glass per se, e.g., small sensitizing amounts of Cu.

The glass articles of this invention can comprise a single composition overall having a silicate base composition, essentially homogeneously and uniformly containing a silver and hydration content. Alternatively, the glass articles can comprise a bulk portion consisting essentially of the base silicate composition. This bulk portion can have a surface layer consisting of essentially the same (or even a different) silicate glass composition having the mentioned silver and hydration content. The layer can be coated onto the bulk portion or can be monolithic therewith, e.g., prepared by suitable treatment of a surface of the bulk composition-based glass article per se.

The glass articles of this invention, of course, will have other characteristics necessary or desirable for the intended end-use. Thus, they will be substantially non-thermoplastic so that they provide surfaces which have sufficient rigidity and integrity for the intended applications, such as use in archival storage, e.g., photomasks, optical disks, optical elements such as diffraction gratings, gunsights, etc. For example, the glass articles of this invention will have surfaces, especially writable surfaces, which are not "thermoplastic" as defined in U.S. Pat. No. 4,160,654 which is entirely incorporated by reference herein. Thus, the articles of this invention will not be capable of thermoplastic molding, pressing or extrusion. They will be non-thermoplastic in the sense that highly sensitive measurements of the nature of the surface before hydration (e.g., interferometrically with a sensitivity/accuracy of at least 5 um) will show no significant or substantial difference in surface quality after hydration treatment. The surfaces will be substantially nondeformable under conditions conventionally employed to deform glass surfaces defined as being "thermoplastic."

Similarly, the glass articles of this invention will have geometric characteristics which are necessary or desirable for the intended end-use. Thus, where the article is to be employed as a photomask or optical disk or similar archival storage medium, it will generally have a high degree of flatness on the written surface and typically be in the form of a rectangular or disk-shaped plate. These characteristics will be satisfactory to meet relevant industry specifications. Consequently, prior art silver-containing silicate surfaces of optical waveguides, optical fibers and similar structures are not included in the scope of this invention.

Essentially any known method for achieving hydration of silicate glasses and/or for achieving a silver content in silicate glasses can be employed to prepare the glass articles of this invention. These include acid treatment for hydration (see, e.g., Roger F. Bartholomew, "Water in Glass," *Treatise on Materials Science and Technology*, Vol. 22, Glass III, eds. Minoru, Tomozawa et al., 75-128 (1982), Academic Press; standard salt bath ion exchangers (see, e.g., U.S. Pat. No. 3,528,847), the well known combination hydration and silver ion-exchange treatments (see, e.g., U.S. Pat. Nos. 4,160,654, 4,191,547 and 4,297,417, incorporated by reference above), CVD techniques (Thin Film Science and Technology, "Coatings on Glass," H. K. Tulker, Elsevier, 1984), thin-film coating techniques (Tulker, supra), silver-bismuth pool electric migration Electro-Float, Silver-bismuth, Pool Treatment, Vol. II, Glass Science and Technology, "Color Generation and Control in Glass," C. R. Bansford, Elsevier (1927)), ion-beam implantation (Tulker, supra), sol-gel techniques (Tulker, supra), etc.

The preferred method is the silver ion exchange which simultaneously hydrates a silicate glass.

The latter can be achieved by conventional acidic silver salt bath treatment. The well known technique is straightforwardly applicable to this invention in conjunction with routine optimization. Typically, suitable temperatures will be up to 374° C., as mentioned in the cited U.S. patents, e.g., 200°-370° C., preferably, 300°-370° C. The pH of the silver salt acidic solution is generally less than 4 and preferably less than 2. Typically, the treatment will be conducted in a conventional autoclave using a pressure of at least 200 psig, more typically greater than 400 psig. The time of reaction (including time to heat up and cool down), as is well known, will depend on the desired depth of ion exchange and will typically be up to 16 hours, but more commonly approximately 2-3 hours.

Typical ion-exchange baths will include sufficient acid to achieve the necessary pH, preferably nitric acid, but also other strong mineral acids such as boric acid, hydrochloric acid, sulfuric acid, etc. Similarly, the precise silver salt utilized is not critical. Where halides are desired in the silver layer, silver halides, of course, can be employed. However, preferably the salt will be silver nitrate in accordance with the prior art. The concentration of the silver salt will typically be 90-95% of its solubility limit in the bath in order to enhance silver exchange but provide adequate safety against undesired precipitation. However, of course, much lower concentrations of silver are also applicable with correspondingly higher treatment times in order to achieve a given layer thickness.

The ion-exchange bath also classically contains salts of other cations which correspond to oxides contained in the base glass composition being treated in order to provide controllability of exchange. Most preferably, these other components will include alkali metal salts such as chlorides, but preferably the nitrates, e.g., preferably lithium nitrate since the alkali metal cations are quite mobile. Other employable salts include those of boron, alkaline earth metals, etc. Typically, these salts are included in the amounts discussed in the prior art, for example, 50-350 g/l. Also, typically included in these baths is silica gel in amounts equal to or in excess of saturation and also halides, e.g., as a salt, a liquid or even as a gaseous additive.

Ion-exchange layer thicknesses achieved can be conventionally varied and are routinely selectable, e.g., by appropriate modification of bath composition and treatment time for a given composition. For the applications of this invention where high resolution images are desired, typically, relatively small layer thicknesses will be desired, for example, less than 10 um, preferably less than 5 um, more preferably less than 2 um, and even lower. Also for considerations related to resolution, the ion-exchange layer thickness will preferably be selected to be smaller than the depth of penetration of the writing beam, such as an electron beam. For example, 20 keV electron beams will typically penetrate silicate glasses to a depth of 3-5 um. The ion-exchanger layer thickness will thus be chosen to be less than this, e.g., typically about 75% less. However, of course, the precise thicknesses will not be critical in accordance with this invention where resolution is not as important, e.g., where the archival storage media are being used to write image features significantly above the 1-10 um level, e.g., for images used in conjunction with printed circuit boards or higher wavelength optical devices, gunsights, etc.

By "hydration content" herein is simply meant the compositional variations achieved in silicate compositions in accordance with the particular conventional hydration treatment utilized as discussed above. Typically, such treatments introduce into the silicate glass composition, $H^+$, $H_3O^*$, $H_2O$, silanol groups, etc.

The high-energy sensitive glass articles of this invention are preferably written by electron-beam irradiation, typically of 5 keV to 100 keV strength, the precise value not being critical and lower and higher values being applicable. Typically, the glass articles of this invention will have a sensitivity such that they can be stably darkened to provide an image having an optical density greater than 1.5 or 2 by only 2-6 scan counts of a 20 keV electron beam common in the industry, e.g., provided by a MEBES III system of Perkin Elmer. However, the media of this invention can also be written via other high-energy beams, such as X-ray radiation, or, where desired, with very high-energy UV radiation. The resultant images will be very accurately and stably readable using radiation to which the materials of this invention are not darkenable, e.g., UV radiation of a wavelength greater than about 360 nm or via visible radiation. The reading wavelength will not be critical as long as it satisfies the properties of the intended end-use and does not cause further significant "writing" of the glass article containing the written image.

The images achieved in accordance with this invention are erasable, simply by heating the written glass articles to a temperature effective for erasure. Suitable temperatures for a given glass can be routinely determined by a few routine experiments. The images are also erasable by instantaneous localized heating via a focused or directed heat supplying medium such as a laser or other energy source.

A major advantage of this invention is that the images having adequate optical density for the intended end-use are also highly stable against all relevant ambient conditions encountered, e.g., in storage, shipping, use, etc.

In another application of the glass articles of this invention, they can be used for generation of relief images in their surfaces by conventional chemical and/or thermal treatments. A written image will render surfaces of the articles of this invention more or less susceptible to such treatments whereby selective etching can be achieved, e.g., by exposure of the entire bulk of the material to such treatments or of the entire surface of the material to such treatments or of only local sections of the material to the treatment, e.g., by reaction with chemical beams, ion beams, lasers, other focused or directed energy beams, etc. See, e.g., EP 0074157.

The preparation of the glasses of this invention can be achieved as follows: the required chemicals are selected and blended into a batch which is then melted in a fused silica, refractory or platinum crucible from 1100° C. to as high as 1500° C. depending on the chosen composition. The glass is then refined at temperatures exceeding 1300° C. for periods typically from 2 to 4 hours, again depending on the glass composition and melt viscosity, with varied intervals of stirring. The glass is then typically cast into a steel mold and annealed at the transformation temperature plus about 20° to 30° C. for two hours, followed by cooling at 30° C./hour to room temperature. The resultant casting of glass can be cut and fabricated into thin plates for treatment by an ion-exchange procedure to activate the surface layer to electron beams.

BRIEF DESCRIPTION OF THE DRAWINGS

FIG. 2 illustrates a typical resultant optical density for an embodiment of the present invention treated at a higher temperature than those in FIG. 1.

EXAMPLES

Figure 1:
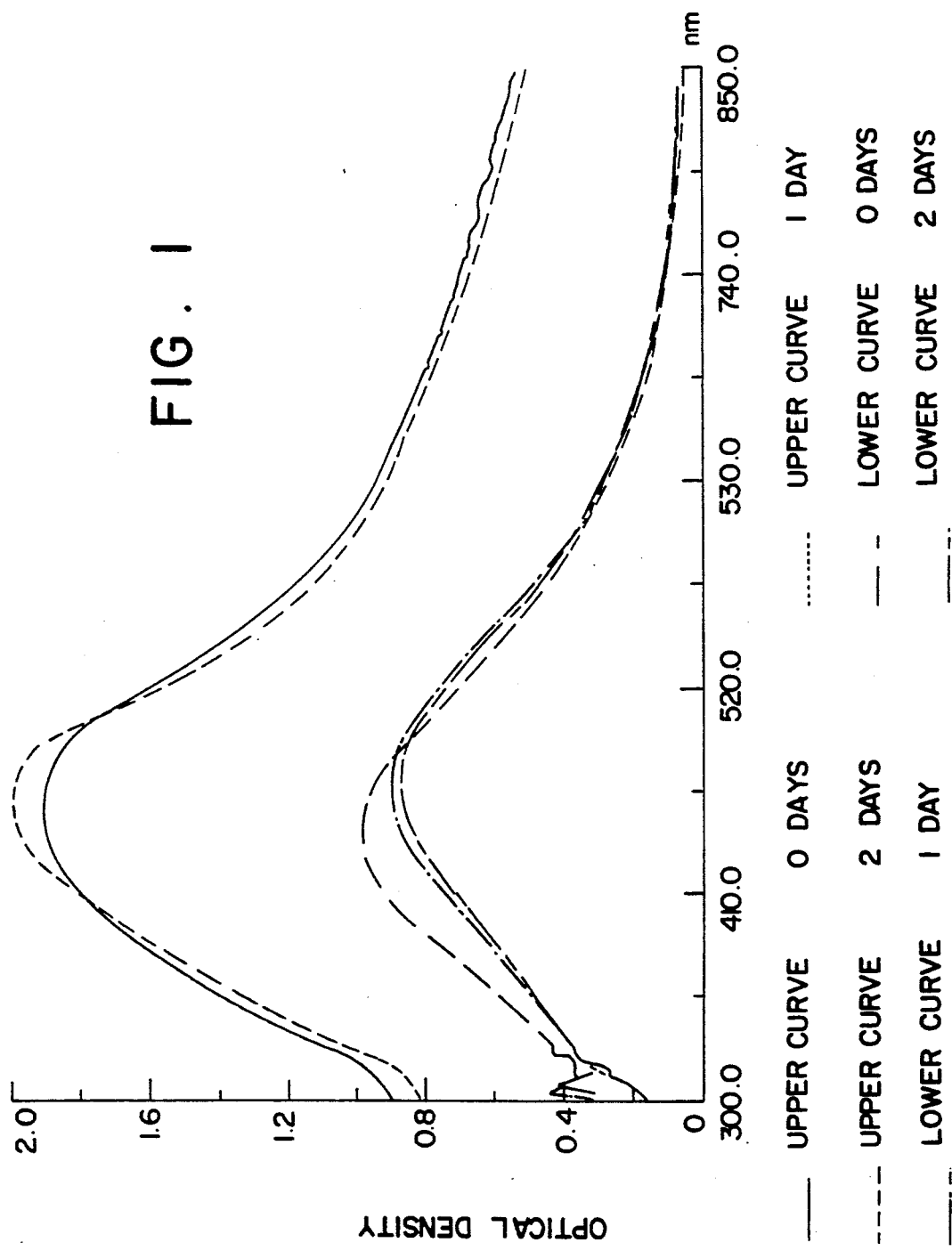
FIG. 1 illustrates a typical resultant optical density for an embodiment of the present invention (upper curves) and a comparative example (lower curves).

The following examples illustrate the application of glass materials prepared in conformance with the present invention. The selected glass composition is first melted without the positive inclusion of any constituents which can lead to later spontaneous reduction of silver ions during the ion-exchange process to sensitize the active layer to electron beams. The preparation of these glasses proceeds in accordance with the above-described melting and forming procedures.

Polished glass plates of the examples are surface treated by silver ion exchange to activate the surface layer to electron beam irradiation. The samples are electron beam irradiated on a JEOL 35c scanning electron microscope operating at 20 keV, with a beam current of 23.6 nA, focused onto a 100 micron spot with a 2-second exposure time. A typical resultant optical density is shown in FIG. 1, upper curves. Following a short term increase in optical density, which reaches completion in less than 24 hours following electron beam exposure, there is no drop in optical density.

Polished glass plates of the examples are ion exchange surface treated at a higher temperature than those above and then electron beam irradiated under the same conditions. A typical resultant optical density is shown in FIG. 2. There is no evidence, within the measurement reproducibly of 0.2 OD in the UMSP-80 microdensitometer, for the short, less than 24 hour, relaxation of optical density to higher values exhibited in FIG. 1. In addition, no decrease was recorded for periods of time up to 10 days after electron beam exposure. The overall lower optical density exhibited by this sample is a result of an ion-exchange penetration depth, measured by analyzing interference in intensity from light reflected from the front face and the layer, of more than 5 microns. The penetration depth of the electron beam used for the irradiations is only 4.5 microns.

COMPARATIVE EXAMPLES

A composition is also melted and surface treated as described above but contains a transition metal oxide containing 1 to 4 d-electrons in the atomic state, i.e., $TiO_2$. It exhibits a time instability of electron beam induced darkening in the material as shown in the lower curves of FIG. 1. Similar behavior of electron beam induced optical density instability with time occurs for samples containing other transition metal oxides which contain from 1 to 4 d-electrons in the atomic state. Surface treatment of these compositions at the higher temperature mentioned above fails to stabilize optical density.

The preceding examples can be repeated with similar success by substituting the generically or specifically described reactants and/or operating conditions of this invention for those used in the preceding examples.

From the foregoing description, one skilled in the art can easily ascertain the essential characteristics of this invention, and without departing from the spirit and scope thereof, can make various changes and modifications of the invention to adapt it to various usages and conditions.

| Examples | Table in Mole % Oxide* | | | | | | | |
|---|---|---|---|---|---|---|---|---|
|  | 1 | 2 | 3 | 4 | 5 | 6 | 7 | 8 |
| $SiO_2$ | 74 | 70 | 76 | 74 | 74 | 74 | 74 | 72 |
| $B_2O_3$ | 2 | 2 | 2 | 2 | 2 | 2 | 1 | 2 |
| $Al_2O_3$ | 1 | 1 | 1 | 1 | 1 | 1 | 1 | 1 |
| $P_2O_5$ |  |  |  |  |  | 1 |  |  |
| MgO |  |  |  |  |  |  |  |  |
| CaO |  |  |  |  |  |  | 7 | 2 |
| SrO |  |  |  |  |  |  |  |  |
| BaO |  |  |  |  |  |  |  |  |
| ZnO | 7 | 7 | 7 | 7 | 7 |  | 7 | 7 |
| PbO |  |  |  |  |  |  |  |  |
| $Li_2O$ | 4 | 5 | 3.5 | 6 | 4 | 4 | 4 | 4 |
| $Na_2O$ | 8 | 10 | 7 | 8 | 8 | 8 | 8 | 8 |
| $K_2O$ | 4 | 5 | 3.5 | 2 | 4 | 4 | 4 | 4 |
| Cl | 3 | 3 | 3 | 3 | 0 | 3 | 3 | 3 |

*Exception is Cl in mole % element.
RO's (R = Mg, Sr, Ba) are similarly included in total amounts up to 7 mole % as replacements for ZnO and/or $SiO_2$.
RO's (R = Pb) are similarly included in total amounts up to 2 mole % as replacements for ZnO and/or $SiO_2$.

Without further elaboration, it is believed that one skilled in the art can, using the preceding description, utilize the present invention to its fullest extent. The following preferred specific embodiments are, therefore, to be construed as merely illustrative, and not limitative of the remainder of the disclosure in any way whatsoever.

What is claimed is:

1. A method of forming an image readable by UV radiation comprising writing said image in a silicate glass article by electron beam irradiation thereof, the glass article comprising the following composition in mole %:

| | |
|---|---|
| $SiO_2$ | 30–95 |
| $P_2O_5$ | 0–20 |
| $B_2O_3$ | 0–30 |
| $Al_2O_3$ | 0–40 |
| RO | 0–40 |
| $R_2O$ | 1–35 |
| halide | 0–10 | and essentially no transition metals having 1–4 d-electrons in the atomic state,
wherein RO is MgO, CaO, SrO, BaO, ZnO and/or PbO,
$R_2O$ is $Li_2O$, $Na_2O$, $K_2O$, $Rb_2O$ and/or $Cs_2O$,
halide is Cl, F, Br and/or I,
at least one surface of said article having a substantially continuous silver and hydration content over its area, effective to render said surface darkenable upon exposure to electron beam radiation but substantially not thermoplastic,
said article being capable of being substantially darkened by electron beam irradiation over at least a portion of at least one surface thereof,
and said article having geometric characteristics suitable for functioning as a photomask reticle, optical disk or similar archival storage medium.

2. A method of claim 1, the silicate glass article having the following composition in mole %:

| | |
|---|---|
| $SiO_2$ | 40–90 |
| $P_2O_5$ | 0–5 |
| $B_2O_3$ | 0–30 |
| $Al_2O_3$ | 0–15 |
| RO | 5–30 |
| $\Sigma Li_2O, Na_2O, K_2O$ | 5–25 |
| halide | 0–6. |

3. A method of claim 1, the silicate glass article having the following composition in mole %:

| | |
|---|---|
| $SiO_2$ | 50–85 |
| $P_2O_5$ | 0–2 |
| $B_2O_3$ | 0–20 |
| $Al_2O_3$ | 0–5 |
| RO | 5–20 |
| $\Sigma Li_2O, Na_2O, K_2O$ | 5–25 |
| Cl | 0.1–6. |

4. A method of claim 1, the silicate glass article comprising a bulk portion of said composition substantially devoid of silver and hydration content and a surface layer of said composition having said substantially continuous silver and hydration content.

5. A method of claim 4, wherein said bulk portion and said layer are monolithic.

6. A method of claim 1, the silicate glass article having said silver and hydration content substantially throughout its entirety.

7. A method of claim 1, the silicate glass article being a photomask reticle.

8. A method of claim 1, the silicate glass article being an optical disk.

9. A method of claim 1, the silicate glass article being an archival storage medium.

10. A method of claim 1, the silicate glass article being a substantially flat plate.

11. A method of claim 1, wherein the silicate glass article can be stably darkened to an optical density greater than 1.5 by 2–6 scan counts of a 20 kev electron beam.

12. A method of claim 1, wherein said silver content is achieved by ion exchange of said glass composition with an acidic solution of a silver salt at a temperature of 200°–370° C., a pressure greater than 200 psig and for a treatment time greater than 30 seconds.

13. A method of claim 12, wherein the concentration of the silver salt in the solution is about 90–95% of its solubility limit.

14. A method of claim 1, wherein said composition contains essentially no metals having 1–4 d-electrons in the atomic state.

15. A method of forming an image readable by UV radiation comprising writing said image in a silicate glass article by electron beam irradiation thereof, the glass article comprising an amount of $SiO_2$ effective as a network former and essentially no transition metals having 1–4 d-electrons in the atomic state, and
at least one surface of said article having a substantially continuous silver and hydration content over its area, effective to render said surface darkenable upon exposure to electron beam radiation but substantially not thermoplastic,
said article being capable of being substantially darkened by electron beam irradiation over at least a portion of at least one surface thereof,
and said article having geometric characteristics suitable for functioning as a photomask reticle, optical disk or similar archival storage medium.

16. A method of forming an image readable by UV radiation comprising writing said image in a silicate glass article by electron beam irradiation thereof, the glass article comprising the following composition in mole %:

| | |
|---|---|
| $SiO_2$ | 30–95 |
| $P_2O_5$ | 0–20 |
| $B_2O_3$ | 0–30 |
| $Al_2O_3$ | 0–40 |
| RO | 0–40 |
| $R_2O$ | 1–35 |
| halide | 0–10 | and essentially no transition metals having 1–4 d-electrons in the atomic state,
wherein RO is MgO, CaO, SrO, BaO, ZnO and/or PbO,
$R_2O$ is $Li_2O$, $Na_2O$, $K_2O$, $Rb_2O$ and/or $Cs_2O$,
halide is Cl, F, Br and/or I,
at least one surface of said article having a substantially continuous silver and hydration content over its area, effective to render said surface darkenable upon exposure to electron beam radiation but substantially not thermoplastic,
said article substantially not exhibiting alterable photo-anisotropic effects inducible by actinic UV radiation,
and said article having geometric characteristics suitable for functioning as a photomask reticle, optical disk or similar archival storage medium.

17. A method of forming an image readable by UV radiation comprising writing said image in a silicate glass article by electron beam irradiation thereof, the silicate glass article comprising the following composition in mole %:

| | |
|---|---|
| $SiO_2$ | 30–95 |
| $P_2O_5$ | 0–20 |
| $B_2O_3$ | 0–30 |
| $Al_2O_3$ | 0–40 |
| RO | 0–40 |
| $R_2O$ | 1–35 |
| halide | 0–10 | and essentially no transition metals having 1–4 d-electrons in the atomic state,
wherein RO is MgO, CaO, SrO, BaO, ZnO and/or PbO,
$R_2O$ is $Li_2O$, $Na_2O$, $K_2O$, $Rb_2$and/or $Cs_2O$,
halide is Cl, F, Br and/or I,
at least one surface of said article having a substantially continuous silver and hydration content over its area, effective to render said surface darkenable upon exposure to electron beam radiation but substantially not thermoplastic,
and said article having geometric characteristics suitable for functioning as either a photomask reticle or an archival storage medium.

18. A method of forming an image readable by UV radiation comprising writing said image in a silicate glass article by electron beam irradiation thereof, the silicate glass article comprising an amount of $SiO_2$ effective as a network former and essentially no transition metals having 1–4 d-electrons in the atomic stage and at least one surface of said article having a substantially continuous silver and hydration content over its area, effective to render said surface darkenable upon exposure to electron beam radiation but substantially not thermoplastic,
and said article having geometric characteristics suitable for functioning as either a photomask reticle or an archival storage medium.

19. A method of erasing the electron-beam darkening of a glass silicate article comprising the following composition in mole %:

| | |
|---|---|
| $SiO_2$ | 30–95 |
| $P_2O_5$ | 0–20 |
| $B_2O_3$ | 0–30 |
| $Al_2O_3$ | 0–40 |
| RO | 0–40 |
| $R_2O$ | 1–35 |
| halide | 0–10 | and essentially no transition metals having 1–4 d-electrons in the atomic state,
wherein RO is MgO, CaO, SrO, BaO, ZnO and/or PbO,
$R_2O$ is $Li_2O$, $Na_2O$, $K_2O$, $Rb_2O$ and/or $Cs_2O$,
halide is Cl, F, Br and/or I,
at least one surface of said article having a substantially continuous silver and hydration content over its area, effective to render said surface darkenable upon exposure to electron beam radiation but substantially not thermoplastic,
said article being capable of being substantially darkened by electron beam irradiation over at least a portion of at least one surface thereof, and
said article having geometric characteristics suitable for functioning as either a photomask reticle or an archival storage medium,
comprising heating said article to a temperature effective for said erasure.

20. A method of forming an image readable by UV radiation comprising writing said image in a silicate glass article by electron beam irradiation thereof, the glass article comprising an amount of $SiO_2$ effective as a network former and essentially no transition metals having 1–4 d-electrons in the atomic state, and
at least one surface of said article having a substantially continuous silver and hydration content over its area, effective to render said surface darkenable upon exposure to electron beam radiation but substantially not thermoplastic,
said article substantially not exhibiting alterable photo-anisotropic effects inducible by actinic UV radiation,
and said article having geometric characteristics suitable for functioning as either a photomask reticle or an archival storage medium.

* * * * *